United States Patent [19]

Banerjee

[11] Patent Number: 4,999,811
[45] Date of Patent: * Mar. 12, 1991

[54] TRENCH DRAM CELL WITH DYNAMIC GAIN

[75] Inventor: Sanjay K. Banerjee, Austin, Tex.

[73] Assignee: Texas Instruments Incorporated, Dallas, Tex.

[*] Notice: The portion of the term of this patent subsequent to Sep. 5, 2006 has been disclaimed.

[21] Appl. No.: 126,523

[22] Filed: Nov. 30, 1987

[51] Int. Cl.⁵ .............................................. G11C 11/24
[52] U.S. Cl. ................................... 365/149; 357/23.6; 365/51
[58] Field of Search ................. 365/149, 174, 182, 51; 357/23.6

[56] References Cited

U.S. PATENT DOCUMENTS

| | | | |
|---|---|---|---|
| 3,706,891 | 12/1972 | Donofrio et al. | 365/149 |
| 4,168,536 | 9/1979 | Joshi et al. | 365/149 |
| 4,430,730 | 2/1984 | Tien | 365/149 |
| 4,432,006 | 2/1984 | Takei | 357/23 |
| 4,448,400 | 5/1984 | Harari | 365/185 |
| 4,704,705 | 11/1987 | Womack | 365/149 |
| 4,716,548 | 12/1987 | Mochizuki | 365/149 |
| 4,763,181 | 8/1988 | Tasch, Jr. | 357/23.6 |
| 4,845,539 | 7/1989 | Inoue | 357/23.6 |
| 4,864,374 | 9/1989 | Banerjee | 357/23.6 |

FOREIGN PATENT DOCUMENTS 0202515 11/1986 European Pat. Off. .

OTHER PUBLICATIONS

Shichijo et al, "TITE RAM: A New SOI DRAM Gain Cell for Mbit DRAM's", Extended Abstracts of the 16th (1984 International) Conference on Solid State Devices and Materials, Kobe, 1984, pp. 265–268.

Primary Examiner—Glenn Gossage
Attorney, Agent, or Firm—Melvin Sharp; Thomas W. Demond; Richard B. Havill

[57] ABSTRACT

A two transistor gain-type dynamic random access memory (DRAM) cell (8) formed in a trench (30) to optimize wafer area requirements. Formed on a heavily doped semiconductor substrate (20) are alternate layers of P-type and N-type semiconductor material defining the elements of a vertical pass transistor (12) and gain transistor (24). A trench is formed through the alternate semiconductor layers into the substrate (20), and filled with two regions of a semiconductor material defining a storage node (18) and, insulated therefrom, a word line (16). The gain transistor (24) is fabricated having a response time faster than that of the pass transistor (12) so that, during read operations, the gain transistor (24) changes the precharged voltage of the read bit line (26), depending upon the charge stored in the capacitor storage node (18).

10 Claims, 2 Drawing Sheets

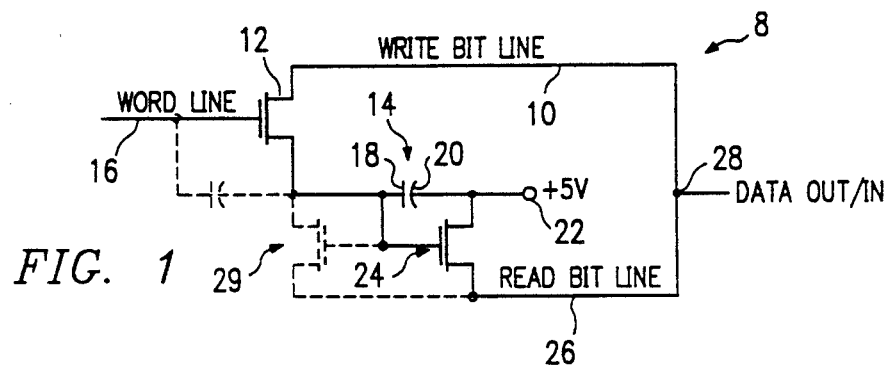
FIG. 1
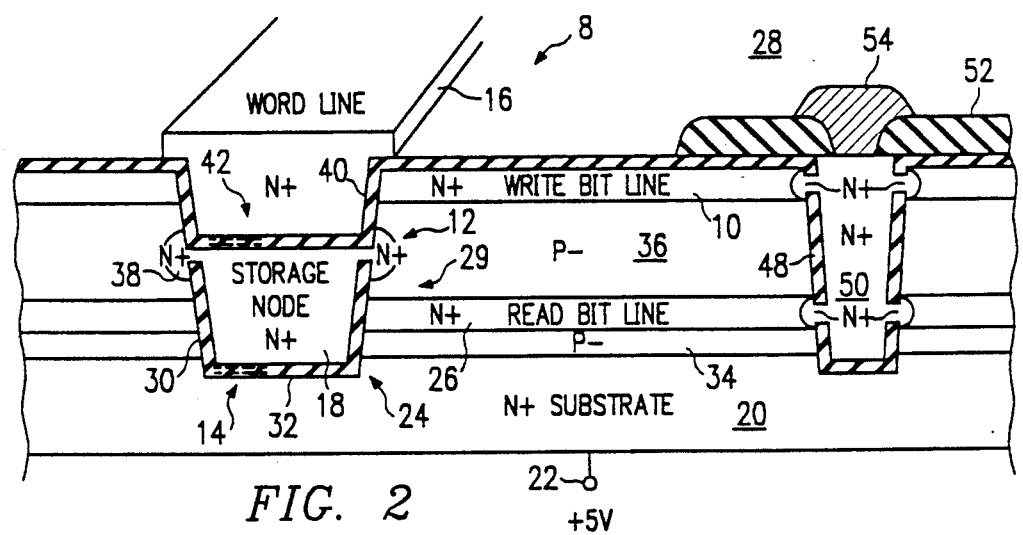
FIG. 2
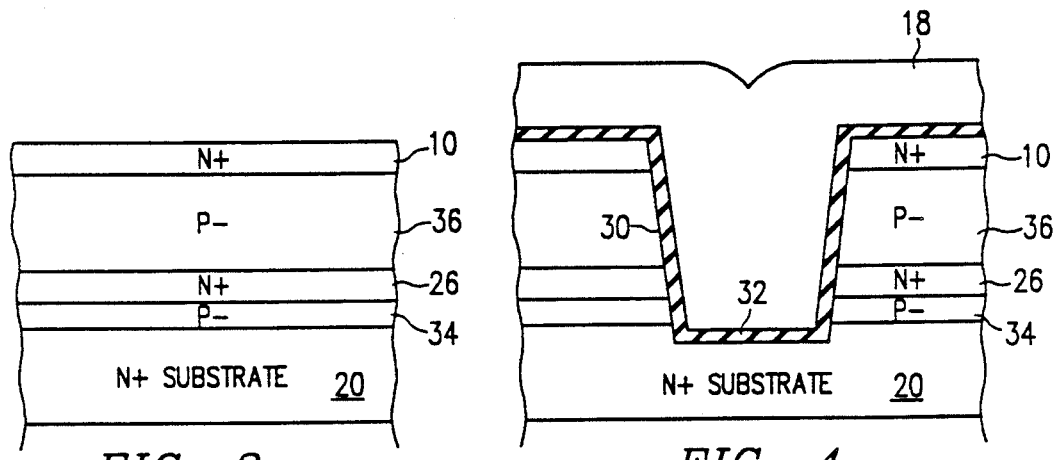
FIG. 3
FIG. 4

TRENCH DRAM CELL WITH DYNAMIC GAIN

RELATED APPLICATION

"TWO-TRANSISTOR DRAM CELL WITH HIGH ALPHA PARTICLE IMMUNITY", by Sanjay K. Banerjee, filed concurrently herewith, Serial No. 126,455, now U.S. Pat. No. 4,864,374.

TECHNICAL FIELD OF THE INVENTION

The present invention relates in general to semiconductor memories, and more particularly relates to dynamic random access memories and methods of fabrication thereof.

BACKGROUND OF THE INVENTION

The development of dynamic random access memories (DRAMs) has made possible the storage capability of over four million bits in a single integrated circuit chip. The packing density of the cells of such memories has been optimized by reducing the area of components comprising each cell. Typically, MOS DRAM cells include a single transistor and a single capacitor for storing the electrical charge corresponding to a logic high or low level. With such a construction, each cell of the memory array is required to be periodically refreshed so as to maintain the logic level stored on the cell capacitor.

MOS memory arrays can be made smaller in size by scaling the entire array, i.e., reducing the size of each component or feature of the array. This, however, has reached a limiting point, in that with small storage capacitors the charge storage capability is reduced, and thus the electrical signal output therefrom becomes difficult to distinguish from noise and other electrical interference normally found in the array. Hence, complex sense amplifiers are required to distinguish the readout signal from the noise signals.

In view of the inherent limitations which accompany the one-transistor DRAM cell, a new type of DRAM cell, with dynamic gain, has been proposed. The construction and operation of one such DRAM cell is disclosed in a technical article "TITE RAM' A New SOI DRAM Gain Cell For Mbit DRAM's", 16th International Conference on Solid State Devices and Materials, 1984, pp. 265-268, S. Banerjee et al. Disclosed in the article is a planar two-transistor DRAM cell employing a pass transistor during write operations to couple the charge from a write bit line to the small area storage capacitor. The word line capacitance associated with the cell is capacitively coupled to the storage capacitor, thereby forming a capacitor divider. When the word line is driven during read operations of the cell, the voltage on the storage node is boosted to a voltage depending on the charge previously stored thereon. The capacitor forms a part of a gain transistor which is adapted to connect a voltage source to a read bit line. If little or no charge is stored on the capacitor, the boosted voltage on the storage node is insufficient to turn on the gain transistor strongly, whereby a precharged voltage existing on the read bit line is not disturbed significantly. However, if a substantial charge has been previously stored on the storage capacitor, the boosted voltage during read operations is sufficient to drive the gain transistor into conduction, thereby placing a substantial charge on the read bit line.

While the two-transistor DRAM cell provides an internal readout gain not found in the one-transistor cell, several shortcomings are still inherent with the cell. First, with small-area planar cells, the storage capacitor is also limited to a small size. Secondly, because the series capacitances of the word line and cell capacitor are usually constructed in different process steps, such capacitances cannot be carefully controlled and thus the magnitude of the boosted voltage applied to the gain transistor also cannot be carefully defined. In addition, the pass transistor of such a two-transistor DRAM cell is most efficiently fabricated using polycrystalline silicon (polysilicon). Such type of transistor is inherently leaky, and thus needs to be refreshed more frequently.

From the foregoing, it can seen that a need exists for an improved gain-type DRAM cell in which the capacitance of the storage capacitor can be made large without significantly affecting the area required by the cell. An associated need exists for a gain-type DRAM cell which can be constructed with a high quality pass transistor to thereby improve the performance of such a cell.

SUMMARY OF THE INVENTION

In accordance with the present invention, an improved gain-type DRAM cell, and method of fabrication thereof, is disclosed which reduces or substantially eliminates the disadvantages and shortcomings associated with the prior art DRAM cells. According to the invention, a gain-type DRAM cell is disclosed having a high quality pass transistor and a large capacitance storage element which requires very little wafer area.

In accordance with the preferred embodiment of the invention, numerous alternating N and P-type semiconductor layers are formed on a substrate to define regions of a vertical gain transistor and a vertical pass transistor. The transistors are constructed on trench sidewalls such that the gain transistor is a high speed device with a relatively high threshold voltage. On the other hand, the pass transistor is constructed to exhibit a slower speed device with a lower threshold voltage. By employing high quality epitaxial semiconductor layers, both such transistors can be fabricated with high performance and low leakage characteristics. A semiconductor layer that forms the source region of the gain transistor also provides a read bit line. The bulk substrate is connected to a supply voltage and forms the drain region of the gain transistor. Also another semiconductor layer which forms the drain region of the pass transistor additionally provides a write bit line.

A narrow trench is formed through the semiconductor layers into the substrate for forming therein the storage capacitor. The trench can be formed as deep as desired to attain the requisite capacitance. In addition, with a narrow and deep trench, the capacitance of the storage capacitor can be made large without requiring a significant amount of wafer area. With a large storage capacitor, it can be assured that a sufficient magnitude of voltage from the series-connected capacitors is coupled to the gain transistor for turning it on.

The sidewalls of the trench are oxidized to form the dielectric of the storage capacitor, which oxide also defines the gate insulator of the gain transistor. The wafer is further processed to form a lateral diffusion of semiconductor material through an opening in the dielectric of the storage capacitor to form a lateral diffused drain region of the pass transistor. In operation when the pass transistor is on, charge on the write bit line is conducted through the pass transistor to the semiconductor material storage node, or plate, of the storage capacitor.

The wafer is again oxidized to insulate the upper portion of the trench for depositing therein a conductive polysilicon word line. The polysilicon word line, together with the upper sidewall oxide, forms a transistor gate electrode and gate insulator for the upper pass transistor.

With the foregoing structure, the gain memory cell of the invention is written by driving the word line to a high voltage level which, in turn, drives the pass transistor into conduction. The electrical charge corresponding to a logic zero or a logic one, then existing on the write bit line, is stored in the storage capacitor, via the conducting pass transistor. During read operations, the word line is again driven to a logic high voltage level. The series connection of capacitances formed by the word line capacitance and the storage capacitor boosts the voltage on the storage node to a certain voltage, depending upon the charge stored in the storage capacitor. In the event a charge corresponding to a logic low level is stored in the storage capacitor, the boosted voltage of the storage node is insufficient to drive the high threshold gain transistor heavily into conduction, and thus the voltage appearing on the read bit line remains practically at its precharge level. On the other hand, if a charge corresponding to a logic one is stored in the storage node, the boosted voltage is high enough for driving the gain transistor heavily into conduction. The gain transistor thus provides a conductive path from the read bit line to the bulk substrate which is connected to a logic high voltage. By so conducting, the gain transistor provides an internal readout gain. Hence, the read bit line voltage swing can be greater than in a conventional one-transistor cell, thereby eliminating the need, in many instances, for complex and high performance sense amplifiers.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, regions or areas throughout the views, and in which:

FIG. 1 is an electrical schematic drawing of the gain DRAM cell of the invention;

FIG. 2 is a sectional view of a gain DRAM cell of the invention; and

FIGS. 3-7 are sectional views of a semiconductor wafer in various stages of the construction of the cell of the invention.

DETAILED DESCRIPTION OF THE INVENTION

Figure 5:
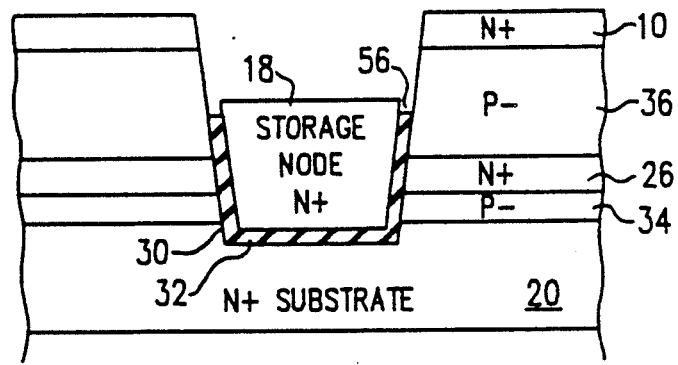

With reference to FIG. 1, there is schematically illustrated the two-transistor gain DRAM cell 8 of the invention. The cell 8 includes a write bit line 10 connected by an N-channel pass transistor 12 to a storage capacitor 14. The pass transistor 12 is driven by a word line 16 for transferring digital information placed on the write bit line 10 to the storage capacitor 14. The storage capacitor 14 has one plate, or storage node 18, connected to the pass transistor 12, and a second plate 20 connected to a supply voltage 22. In the preferred form of the invention, the supply 22, has a magnitude of about 5 volts, and is connected to the bulk of the silicon substrate which forms the plate 20 of the storage capacitor 14. Connected across the storage capacitor 14 is a gain transistor 24 for providing an output of the cell. The gain transistor 24 includes a gate connected to the storage node 18 of the capacitor 14, and a drain connected to the capacitor plate 20, or substrate, of the cell 8. The source of the gain transistor 24 is connected to a read bit line 26 to provide an output of the cell during read operations. The write bit line 10 and the read bit line 26 are connected together by a buried connection 28. There exists a parasitic transistor 29 connected between the storage node 18 and the read bit line 26, which directly transfers charge from the storage node to the read bit line without any internal gain.

In brief summary, the gain cell 8 of FIG. 1 is written with information by driving the word line 16 to a logic high level. The word line signal drives the pass transistor 12 into conduction, thereby connecting the write bit line 10 through a low impedance path to the storage node plate 18 of the storage capacitor 14. A data signal representing either a zero or a one is applied to the data OUT/IN lead and therefore to the write bit line. As a result, the charge from the write bit line and corresponding to either a logic zero or a logic one is transferred from the write bit line 10 to the storage capacitor 14. Importantly, the turn-on threshold voltage of the gain transistor 24 or parasitic transistor 29 is higher than the turn-on threshold voltage of the pass transistor 12 so that during write operations the gain transistor 12 is not inadvertently turned on strongly.

A read operation of the gain cell 8 of the invention is accomplished by driving the word line 16 to a logic high level which, according to the invention, raises the voltage on the storage capacitor plate 18 to a voltage level which is a function of the charge stored on such capacitor 14. The read bit line 26 is precharged to about 2.5 volts. The pass transistor 12 is to have a slower response than the response of the gain transistor 24. Preferably, the conduction channel of the pass transistor 12 is made substantially longer than that of the gain transistor 24, thus reducing the gain of the pass transistor 12 and rendering it slower in response to electrical signals. The parasitic transistor 29 is designed to have low gain and a high threshold compared to both of the transistors 12 and 24 to prevent the parasitic transistor from inadvertently turning on strongly during read and write operations. The noted response times of the transistors are important to the operation of the cell 8, especially during read operations so that the pass transistor 12 and parasitic transistor 29 remain nonconductive for a time sufficient to allow the gain transistor 24 to charge up the read bit line 26 when reading a logic one, or to allow the read bit line 26 to remain at the 2.5 volt precharged level when reading a logic zero. The write and read bit lines are precharged to 2.5V only prior to the read operation. Otherwise, the bit lines are normally precharged to 5V to prevent leakage from the substrate 20 (held at 5V) to the read bit line 26 through the gain transistor 24.

In any event, when the word line 16 is driven to a logic high level, the capacitance of the word line 16 is in series with that of the storage capacitor 14, thereby defining a capacitor divider. Thus, when the word line 16 is driven to, for example, five volts, and if substantially no charge is stored on the capacitor 14, the storage plate 18 of the capacitor 14 will be raised or boosted to a fraction of five volts depending on the capacitor divider ratio. Because there is substantially no voltage across the storage capacitor 14, the gate to source voltage of the gain transistor 24 does not exceed its threshold voltage and thus such transistor remains in a nonconductive state. As a result, there is no conductive path from the supply voltage 22 to the read line 26 which remains at its precharged voltage level.

On the other hand, during a read operation when the word line 16 is driven to a logic high level and while a five volt charge is stored on the storage capacitor 14, the storage capacitor plate 18 will be boosted to about ten volts depending on the ratio of the capacitor divider. Hence, the storage capacitor plate 18 will be at about a ten volt level, while the other capacitor plate 20 will be at a five volt level. The five volt difference across the storage capacitor 14 exceeds the threshold voltage of the gain transistor 24, whereupon such transistor 24 will be driven heavily into conduction and will transfer a lot of charge from the voltage supply 22 to the read bit line 26. In contrast with prior DRAM cells, the gain cell 8 of the invention does not couple stored charge from the storage capacitor 14 directly onto the read bit line 26, but rather couples the stored charge from the storage capacitor 14 through a gain transistor 24 onto the read bit line 26, thereby providing a large signal to sense amplifiers. As will be described in more detail below, by fabricating the gain cell as a trench structure in a semiconductor substrate, the area of such a cell can be made as small as prior planar-type DRAM cells, despite the addition of the gain transistor 24. Indeed, the invention allows the storage capacitor 14 to have as large a capacitance as required for excellent operation without sacrificing substantial wafer area.

In order to facilitate the understanding of the invention, there is depicted in FIG. 2 a portion of a memory array having one of many trench gain-type DRAM cells. The integrated circuit structure of the gain-type DRAM cell 8 includes a trench 30 formed in a number of layers of semiconductor material, down to the N+ substrate 20. As noted, the substrate 20 is connected by conventional means to a supply of DC voltage 22. The trench 30 has formed on the sidewalls and bottom surface thereof a thin dielectric 32 which also serves as a gate insulator for the gain transistor 24. A substantial part of the trench 30 is filled with a heavily doped semiconductor material forming the storage node 18, or one plate of the storage capacitor 14. The other plate of the storage comprises the semiconductor substrate 20 which is separated from the storage capacitor plate 18 by the thin electrical insulating dielectric 32. The top of the trench 30 is filled with a doped polysilicon, forming the word line 16.

A number of layers of semiconductor material formed on the substrate 20 define the various elements of the pass transistor 12, the gain transistor 24, as well as the write bit line 10 and the read bit line 26. A lightly doped P-type semiconductor layer 34 forms the conduction channel of the gain transistor 24. The heavily doped N+ read bit line 26 and the heavily doped N+ substrate 20 form the respective source and drain regions of the gain transistor 24. The thin dielectric 32 defines the gate insulator of the gain transistor 24 and the storage capacitor plate 18 defines the gate conductor. Formed on the read bit line 26 is another lightly doped P-type semiconductor layer 36 which defines the conduction channel of the pass transistor 12. The heavily doped N+ write bit line 10 and a heavily doped N+ laterally diffused region 38 define the respective drain and source regions of the pass transistor 12. A thin dielectric 40 defines the gate insulator of the pass transistor 12, while the heavily doped N+ word line 16 defines the gate conductor thereof. The thin dielectric 40 also provides electrical isolation between the storage capacitor plate 18 and the word line 16, such elements defining a capacitor 42 shown in broken lines in FIG. 2. Capacitor 42 is in series with the cell storage capacitance 14 in FIG. 1, which is shown in broken lines as reference character 14 in FIG. 2. As noted above, the series connection of capacitors 42 and 14 is essential to the operation of the two transistor gain DRAM cell of the invention.

The write bit line 10 and the read bit line 26 are connected at a location remote from the cell 8 by any conventional technique, such as the trench connection 28. The trench connection 28 includes a dielectric lined trench 48 filled with a conductive material 50, such as heavily doped polysilicon. The dielectric is removed at lateral locations corresponding to the write bit line 10 and the read bit line 26, through which electrical contacts are made to the conductive material 50 filling the trench 48. The conductive material extending between the conductive material 50 and the respective write bit line 10 and read bit line 26 is fabricated much like the laterally diffused semiconductor region 38 of the two transistor gain DRAM cell 8. Illustrated is passivating layer 52 covering the surface of the wafer, and an opening formed therein through which a metal contact 54 is formed in contact with the conductive material 50 filling the trench 48. With such an arrangement, a connection can be made to contact 54 for reading and writing the gain DRAM cell 8 via the write bit line 10 and the read bit line 26. Adjacent bit lines of adjacent cells are laterally isolated by deep trench grooves filled with an oxide.

Having described the general construction and operation of the gain DRAM cell 8 of the invention, the fabrication steps thereof are next described in detail. As shown in FIG. 3, the fabrication commences by selecting a semiconductor substrate 20 suitably doped with an N+ impurity to provide a highly conductive substrate. The substrate 20 can be doped with phosphorus at a concentration of about $1 \times 10^{19}$ atoms per cm$^3$. Next, an epitaxial layer 34 of silicon material is deposited on the substrate 20. The epitaxial layer 34 may be deposited in situ as a semiconductor material lightly doped with a P-type impurity, or deposited and doped thereafter by diffusion or ion implant techniques. Layer 34 may be doped with a P-type impurity such as boron. Since the lightly doped P-layer 34 defines the conduction channel of the gain transistor 24, such layer 34 can be appropriately doped to achieve a desired threshold of such transistor. Preferably, a threshold of about 1 to 1.5 volts is desirable. In addition, the depth of the epitaxial layer 34 corresponds to the channel length of the gain transistor 24 which, according to the preferred form of the invention, should be short. For a high gain MOS transistor, the channel length should be short. Accordingly, the epitaxial layer 34 is formed with a thickness of about one micron.

Deposited on top of the P-type epitaxial layer 34 is another epitaxial layer of silicon material which forms the read bit line 26. The epitaxial layer for the read bit line 26 is heavily doped with an N+ impurity, such as phosphorus. The read bit line epitaxial layer 26 is rather shallow, about 1.5 microns thick. However, the read bit line 26 should exhibit low resistance, and thus the lateral width of the read bit line 26 may have the same dimension as the trench 30.

Next, an additional epitaxial layer 36 of a P-type material is deposited on the layer of the read bit line 26. The P-type layer 36 defines the conduction channel of the pass transistor 12, and thus has a depth sufficient to provide a long conduction channel, and thus a low gain. By fabricating the pass transistor 12 and the gain transistor 24 with single crystal silicon epitaxial material, high quality and low leakage transistors can be obtained. In addition, it is significant that the pass transistor 12 be substantially slower in response than the gain transistor 24. The low gain characteristics of the pass transistor 12 achieve the slow response characteristics. In the preferred form of the invention, the epitaxial layer 36 is deposited to a depth of about 4 to 5 microns. In addition, the impurity concentration of the P-type dopant can be adjusted to achieve a pass transistor threshold of about 0.7 volt. To be described more fully below, the epitaxial layer 36 is somewhat thicker than the desired transistor channel length, the excess thereof being utilized to form therein the write bit line 10. The write bit line 10 is formed by diffusing an N+ impurity, such as phosphorus, into the upper portion of the epitaxial layer 36. In this manner, the top of the epitaxial layer 36 is counter-doped to form a heavily doped and low resistance conductor for carrying charge for storage on the cell storage capacitor 14 during write operations.

The layered semiconductor structure is readied for further processing by depositing a layer of oxide and/or photoresist (not shown) thereover and patterning it to define an opening for a trench 30. The wafer is then subjected to an anisotropic etch, such as a plasma reactive ion etch (RIE), to remove the semiconductor material in the opening and to remove such material in a downward direction. As depicted in FIG.4, the anisotropic etch process is continued until a trench 30 about eight microns deep is formed down through the layers into the substrate 20. After the photoresist and/or oxide mask material is removed, a layer of silicon oxide 32 is then formed over the surface of the silicon material by subjecting the wafer to a silicon oxidizing ambient. The silicon oxide layer defines both the capacitor dielectric 32 and the gate insulator of the gain transistor 24, and thus should be somewhat thin. Preferably, the silicon material 32 is oxidized until about 100-150 angstroms of silicon oxide have been grown. Next, and as further noted in FIG. 4, a layer of highly doped polysilicon is deposited over the surface of the wafer to form the storage node 18 of the capacitor. The polysilicon of the storage node 18 is doped to a high concentration $1 \times 10^{19}$ of, for example, a phosphorus impurity.

The wafer is then appropriately etched to remove the surface polysilicon, thereby leaving that which is deposited in the lower portion of the trench 30. This is shown in FIG. 5 of the drawings. The wafer is then subjected to a wet etch to selectively remove the exposed silicon oxide 32, without affecting the N+ polysilicon of the storage node 18. A buffered hydrofluoric (HF) solution is suitable for such a selective oxide etch. As a result of the wet etch, a portion of the thin silicon oxide layer 32 is removed, forming a relief 56 around the circumference of the trench 30. The relief 56 in the silicon oxide dielectric 32 is effective in the formation of the lateral diffused semiconductor region 38, to be described in more detail below.

Figure 6:
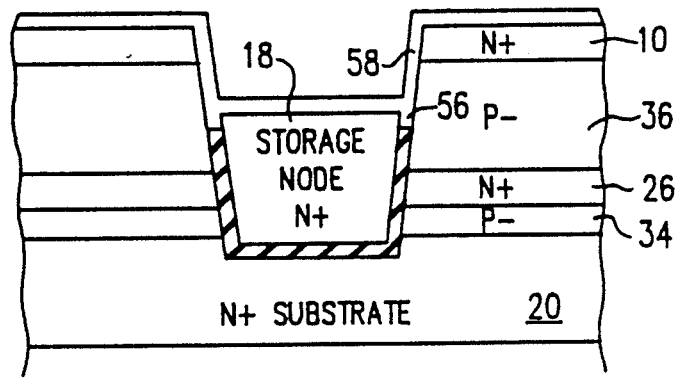

As shown in FIG. 6, a conformal layer 58 of undoped polysilicon is thereafter deposited over the surface of the wafer, to a thickness sufficient to fill the relief 56. The wafer is then etched to remove substantially all of the conformal polysilicon 58, leaving only that which fills the relief 56.

Figure 7:
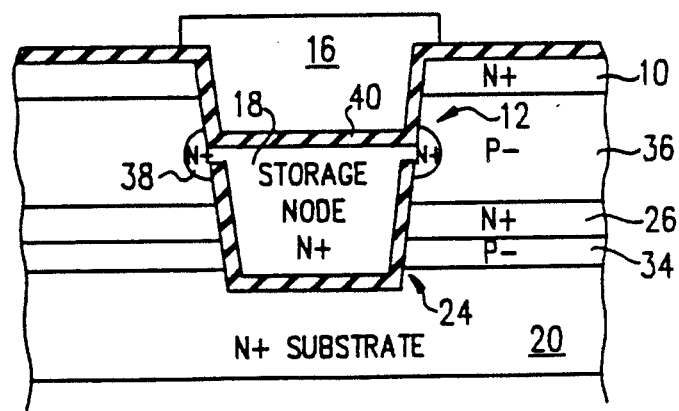

As shown in FIG. 7, the wafer is again subjected to a silicon oxidizing ambient, in which a layer 40 of silicon oxide is formed. The silicon oxide layer 40 defines the capacitor dielectric between the word line 16 and the storage node 18, as well as the gate insulator of the pass transistor 12. The silicon oxide dielectric 40 is grown to a thickness of about 250 angstroms. During the oxidizing step in which the dielectric layer 40 is formed, the impurities of the polysilicon storage node 18 diffuse outwardly through the polysilicon-filled relief 56, thereby forming the annular N+ drain region 38 of the pass transistor 12. When so formed, the semiconductor material and impurity type of the region 38 is homogeneous with that of the storage capacitor plate 18, such regions thereby being electrically connected through the relief 56 in the sidewall dielectric 32.

A layer 16 of N+ doped polysilicon is next deposited over the surface of the wafer, to a depth sufficient to fill the remainder of the trench 30. The polysilicon layer 16 is heavily doped with an N+ impurity, sufficient to form a conductive word line of the cell 8. The polysilicon layer 16 is patterned and etched to define a word line connecting together a number of similar gain-type memory cells of the invention.

The trench-type contact 28, shown in FIG. 2, may be fabricated using many of the same steps employed in forming the two transistor gain DRAM cell 8. For example, the relief in the trench sidewall oxide may be formed in a manner similar to that described in connection with the DRAM cell 8, as well as the method of forming the conductive channels through the sidewall, thereby connecting the write bit line 10 to the read bit line 26. Of course, many other techniques may be employed to provide an electrical connection between the write bit line 10 and the read bit line 26.

From the foregoing, disclosed is a trench-type gain DRAM cell which achieves many advantages not realized by DRAM cells heretofore known. A major technical advantage presented by the invention is that a DRAM cell can be constructed having a gain characteristic, without substantially increasing the wafer area required for the cell. While an additional transistor is required to provide the requisite gain characteristics, the cell storage capacitor is fabricated in a trench, thereby allowing the capacitor silicon surface area to be made small, and the overall wafer area of the two-transistor cell to be reduced. An additional technical advantage of the invention is that the pass transistor is fabricated of single crystal silicon material, thereby providing a high quality transistor with low leakage characteristics. The advantage flowing from this construction is that intervals between refresh periods can be increased, thereby requiring a smaller number of refresh cycles over a period of time.

Therefore, while the preferred embodiment of the invention has been disclosed with reference to a particular two transistor gain-type DRAM cell, it is understood that many changes in detail may be made as a matter of engineering choices without departing from the spirit and scope of the invention, as defined by the appended claims.

What is claimed is:

1. A semiconductor dynamic random access (DRAM) cell, comprising:

a layered semiconductor formed on a substrate having a number of layers, the layered semiconductor having a trench formed therein, with sidewalls of the trench cut through the layers and with a bottom of the trench in the substrate;

a dielectric formed along the sidewalls and bottom in said trench;

a storage node material contacting the dielectric within the trench, the storage node material together with the dielectric and the substrate defining a storage capacitor;

a vertical gain transistor including source and drain regions formed adjacent said trench, said storage node being a gate electrode and said dielectric defining a gate insulator of said vertical gain transistor;

a terminal for connecting a voltage supply to the substrate and the drain region of said vertical gain transistor;

the source region of said vertical gain transistor defining a portion of a bit line for providing a path for an output signal during read operations of said DRAM cell;

a vertical pass transistor including source and drain regions formed adjacent said trench, said vertical pass transistor having a channel connected between said bit line and said storage node for providing charge to said DRAM cell during write operations thereof; and a gate electrode of the vertical pass transistor for connecting with a word line operative to control said vertical pass transistor during write operations and to control said vertical gain transistor during read operations.

2. The semiconductor DRAM cell of claim 1, wherein said word line is partially formed within said trench; and a gate insulator of the pass transistor electrically isolates said word line from the sidewalls of said trench.

3. The semiconductor DRAM cell of claim 1, further including an insulator between said word line and said storage node material to form a capacitor in series with said storage capacitor.

4. The DRAM cell of claim 1, wherein said vertical pass transistor is formed with single crystal silicon material.

5. The DRAM cell of claim 1, wherein said vertical pass transistor has a turn-on response which is slower than a turn-on response of said vertical gain transistor.

6. The DRAM cell of claim 1, wherein said vertical gain transistor has a threshold voltage higher than a threshold voltage of said pass transistor.

7. The DRAM cell of claim 1, wherein said vertical gain transistor and said vertical pass transistor comprise MOS transistors, and wherein said vertical gain transistor has a channel length shorter than a channel length of said vertical pass transistor.

8. The semiconductor DRAM cell of claim 1, further including a diffused region forming said source region of said vertical pass transistor, and wherein said bit line is spaced apart from said source region of said vertical pass transistor and defines said drain region of said vertical pass transistor.

9. The semiconductor DRAM cell of claim 8, wherein said bit line is bifurcated into two semiconductor regions adjacent said cell, a first region defining both a write bit line and said drain region of said vertical pass transistor, and a second region defining both a read bit line and said source region of said vertical gain transistor.

10. The semiconductor DRAM cell of claim 9, wherein said substrate defines said drain region of said vertical gain transistor.

* * * * *

UNITED STATES PATENT AND TRADEMARK OFFICE
CERTIFICATE OF CORRECTION

PATENT NO. : 4,999,811

DATED : March 12, 1991

INVENTOR(S) : Sanjay K. Banerjee

It is certified that error appears in the above-identified patent and that said Letters Patent is hereby corrected as shown below:

Column 2, line 65, delete "semiconductor material" and substitute therefor --dopants--.

Column 4, line 30, delete "12" and substitute therefor --24--;
line 63, delete "that" and substitute therefor --the capacitance--.

Column 5, line 48, "storage", insert --capacitor--.

Signed and Sealed this

Twenty-ninth Day of June, 1993

Attest:

MICHAEL K. KIRK

*Attesting Officer*  *Acting Commissioner of Patents and Trademarks*